US009048153B2

(12) United States Patent
Vaillant

(10) Patent No.: US 9,048,153 B2
(45) Date of Patent: Jun. 2, 2015

(54) THREE-DIMENSIONAL IMAGE SENSOR

(75) Inventor: Jérôme Vaillant, Grenoble (FR)

(73) Assignee: STMicroelectronics (Grenoble 2) SAS, Grenoble (FR)

(*) Notice: Subject to any disclaimer, the term of this patent is extended or adjusted under 35 U.S.C. 154(b) by 838 days.

(21) Appl. No.: 13/326,951

(22) Filed: Dec. 15, 2011

(65) Prior Publication Data
US 2012/0162410 A1 Jun. 28, 2012

(30) Foreign Application Priority Data
Dec. 22, 2010 (FR) .................................... 10 61073

(51) Int. Cl.
*H04N 13/02* (2006.01)
*H01L 27/146* (2006.01)
*G01C 3/08* (2006.01)
*G06F 17/50* (2006.01)

(52) U.S. Cl.
CPC .......... *H01L 27/14603* (2013.01); *G01C 3/085* (2013.01); *H01L 27/14623* (2013.01); *H01L 27/14625* (2013.01); *H01L 27/14645* (2013.01)

(58) Field of Classification Search
CPC ...... G01B 11/022; G01B 11/024; H04N 7/18; H04N 7/181; G01C 15/00
USPC ........................................................ 348/135
See application file for complete search history.

(56) References Cited

U.S. PATENT DOCUMENTS

| 4,394,683 | A * | 7/1983 | Liptay-Wagner et al. ..... 348/128 |
| 6,226,004 | B1 * | 5/2001 | Nishihara ...................... 345/420 |
| 7,058,252 | B2 * | 6/2006 | Woodgate et al. ............... 385/16 |
| 2001/0045979 | A1 * | 11/2001 | Matsumoto et al. ............ 348/43 |
| 2005/0285966 | A1 * | 12/2005 | Bamji et al. .................... 348/336 |
| 2006/0006309 | A1 * | 1/2006 | Dimsdale et al. ............ 250/206.1 |
| 2007/0099625 | A1 * | 5/2007 | Rosenfeld .................. 455/456.1 |
| 2007/0230945 | A1 * | 10/2007 | Shiohara ........................ 396/374 |
| 2008/0080028 | A1 * | 4/2008 | Bakin et al. ..................... 358/514 |
| 2009/0225217 | A1 * | 9/2009 | Katsuda et al. ................ 348/366 |
| 2009/0284645 | A1 * | 11/2009 | Nozaki et al. ................. 348/349 |
| 2010/0033611 | A1 * | 2/2010 | Lee et al. ....................... 348/302 |
| 2010/0059844 | A1 * | 3/2010 | Tanaka .......................... 257/432 |
| 2010/0259648 | A1 | 10/2010 | Iijima et al. |

FOREIGN PATENT DOCUMENTS

| EP | 0645659 A2 | 3/1995 |
| EP | 0981245 A2 | 2/2000 |
| WO | WO 9926419 A1 | 5/1999 |

OTHER PUBLICATIONS

French Search Report and Written Opinion dated Jul. 8, 2011 from corresponding French Application No. 10/61073.
French Search Report and Written Opinion dated Jul. 28, 2011 from related French Application No. 10/61237.

* cited by examiner

*Primary Examiner* — Sath V Perungavoor
*Assistant Examiner* — Howard D Brown, Jr.
(74) *Attorney, Agent, or Firm* — Gardere Wynne Sewell LLP

(57) ABSTRACT

An integrated image sensor capable of determining the distance to objects contained in a scene including at least a set of first pixels and a set of second pixels, the first and second pixels being alternately distributed in an array, the first pixels having a different angular aperture than the second pixels.

34 Claims, 3 Drawing Sheets

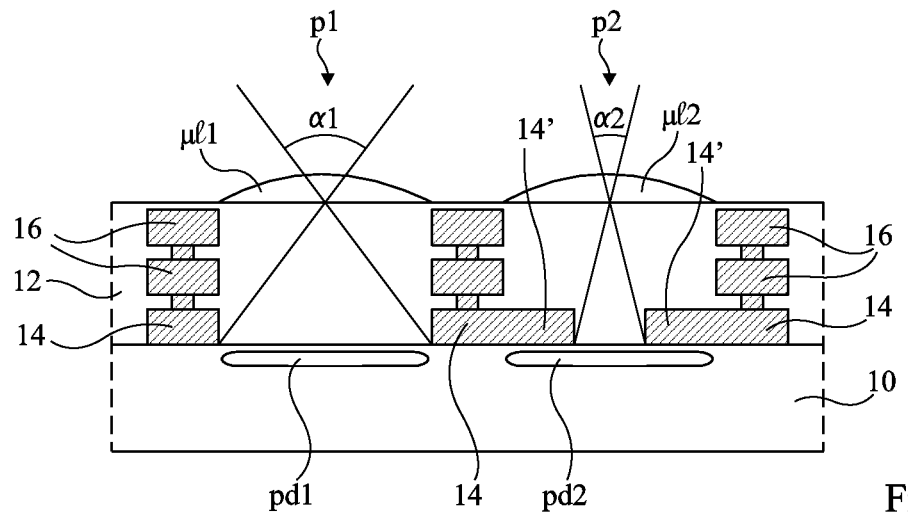
Fig 5
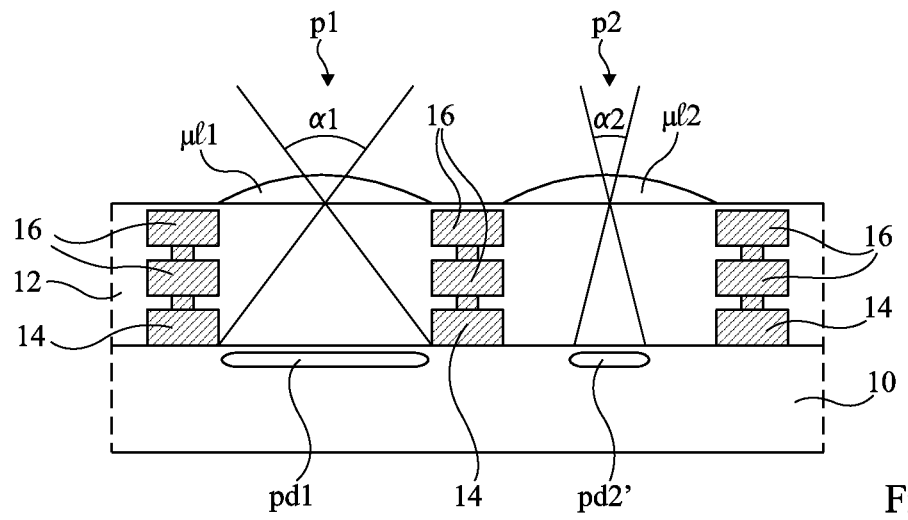
Fig 6
| G₁ | B₁ | G₂ | B₂ |
|---|---|---|---|
| R₁ | G₁' | R₂ | G₂' |
| G₃ | B₃ | G₄ | B₄ |
| R₃ | G₃' | R₄ | G₄' |
Fig 7

THREE-DIMENSIONAL IMAGE SENSOR

CROSS REFERENCE TO RELATED APPLICATIONS

This application claims the priority benefit of French patent application Ser. No. 10/61073 filed on Dec. 22, 2010, entitled THREE-DIMENSIONAL IMAGE SENSOR, which is hereby incorporated by reference to the maximum extent allowable by law.

BACKGROUND

1. Technical Field

Embodiments relate to a three-dimensional integrated image sensor enabling to obtain information relative to the distance to objects contained in a scene. More specifically, the present invention relates to such a sensor capable of detecting objects at macroscopic distances.

2. Discussion of the Related Art

"Three-dimensional (3D) macroscopic image sensor" here designates image sensors that allow measurement of the remoteness of objects located at distances greater than approximately one centimeter.

Many techniques for acquiring three-dimensional images and obtaining information as to the distance to objects are known. Among these, stereo vision techniques provide, to obtain a 3D rendering of an image, performing two acquisitions of a same scene by means of two cameras placed at distant points. The two images acquired by the two cameras are then modified by being applied, for example, to a color filter, and then combined. For the reading of the image, two color filters, each capable of filtering one of the two initial images, are placed before a person's eyes. The human brain combines the two images seen by the person's two eyes and reconstructs the initial three-dimensional image.

Using this technique to perform an automated mapping of the distance to objects contained in a scene (stereoscopic method) is relatively complex. Indeed, to perform such a mapping, the two cameras should be perfectly aligned with the objects contained in the scene, and a system for decoding the complex data should be used to obtain information as to the remoteness of the objects. It is thus difficult to manufacture mobile devices using this method.

Another method for determining the distance to an object is known as the TOF method ("Time of Flight"). This method, especially used in aeronautics, comprises sending a wave, for example, a light or acoustic wave, towards an object and calculating the time taken by the wave to travel to the object and back. This method is however not adapted to the measurement of short distances. Indeed, in this case, the time taken by the wave to travel to the object and back is too short to be easily detected by a sensor and does not enable to accurately determine close distances. Further, this method is not compatible with the performing of an instantaneous mapping of distances to objects. Indeed, such an instantaneous determination would need the transmitted wave to have a very high power to reach an extensive area of the image, which is incompatible with the forming of portable devices.

The use of triangulation methods in which a laser scans a scene to obtain the distance to objects of this scene is also known. However, such methods are only accurate if the scene is not moving: they may need too long a response time to acquire information corresponding to a moving scene.

Thus, most known solutions require transceiver system which should be accurately aligned, an active light source, and/or imply long response times.

SUMMARY

An embodiment aims at providing an image sensor enabling to determine the distance to objects contained in a scene, having a low response time and overcoming all or part of the disadvantages of prior art sensors.

Another embodiment aims at providing an image sensor further enabling to provide information relative to the image of the scene.

Another embodiment aims at providing a three-dimensional image sensor.

Thus, an embodiment provides an integrated image sensor capable of determining the distance to objects contained in a scene comprising at least a set of first pixels a set of second pixels, the first and second pixels being alternately distributed in an array, the first pixels having a different angular aperture than the second pixels, means for comparing a first sub-image obtained by the set of first pixels with a second sub-image obtained by the set of second pixels, and analysis means capable of determining the size difference between objects of the scene contained in the first and second sub-images and of deducing therefrom the distance to these objects.

According to an embodiment, the different angular apertures of the first and of the second pixels are obtained by forming, in the first and second pixels, photodetection areas having different surface areas.

According to an embodiment, the different angular apertures of the first and of the second pixels are obtained by forming, in front of the periphery of photodetection areas formed in the pixels and between the scene to be analyzed and the photodetection areas, an opaque mask.

According to an embodiment, the sensor comprises a semiconductor substrate having photodetection areas and elements for transferring photogenerated charges topped with a stack of interconnection levels comprising metal tracks surrounded with an insulating material formed on one of its surfaces, the sensor being illuminated on this surface.

According to an embodiment, the different angular apertures of the first pixels and of the second pixels are obtained by forming extensions of metal tracks in front of the periphery of the photodetection areas.

According to an embodiment, the different angular apertures of the first pixels and of the second pixels are obtained by forming extensions of charge transfer elements in front of the periphery of the photodetection areas.

According to an embodiment, the different angular apertures of the first pixels and of the second pixels are obtained by forming insulated silicide elements on the periphery of the photodetection areas.

According to an embodiment, the array pixels are associated with color filters distributed in a Bayer pattern, first pixels being associated with the blue and red color filters and with first green color filters, second pixels being associated with second green color filters of the pattern.

An embodiment further provides a method for determining the distance to objects contained in a scene using an integrated image sensor such as defined hereabove, comprising the steps of: acquiring a scene; comparing a first sub-image detected by the set of first pixels with a second sub-image detected by the set of second pixels; determining the size differences between corresponding objects contained in the first sub-image and in the second sub-image; and comparing the size differences of the objects with a database to associate them with distances to objects in the scene.

The foregoing and other objects, features, and advantages will be discussed in detail in the following non-limiting description of specific embodiments in connection with the accompanying drawings.

BRIEF DESCRIPTION OF THE DRAWINGS

FIGS. 4, 5, and 6 illustrate three variations of pixels of an image sensor according to an embodiment; and FIG. 7 illustrates an example of distribution of color filters formed in front of elementary cells of a three-dimensional color image sensor according to an embodiment.

For clarity, the same elements have been designated with the same reference numerals in the different drawings and, further, as usual in the representation of image sensors, the various drawings are not to scale.

DETAILED DESCRIPTION

FIGS. 1A, 1B, 2A, and 2B illustrate the basic operating principle of an image sensor according to an embodiment.

Figure 1A:
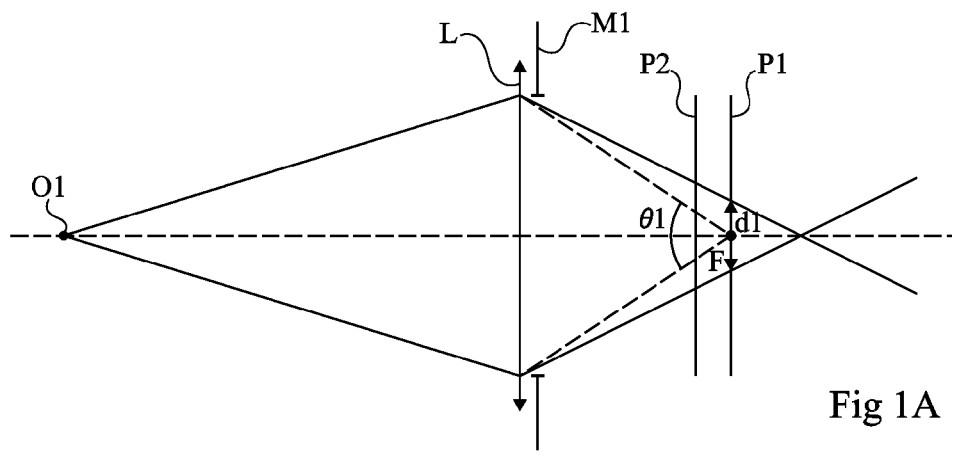
FIGS. 1A, 1B, 2A, and 2B show optical systems illustrating the operating principle of an image sensor according to an embodiment.

These drawings show an optical device comprising a converging lens L. The focal point of the lens on its optical axis is called F and its focal plane is called P1. A shutter, placed against the lens, is provided to limit its angular aperture. In the case of FIGS. 1A and 2A, a shutter M1 only slightly limiting the angular aperture of the lens is provided while, in the case of FIGS. 1B and 2B, a second shutter M2, having a smaller opening than shutter M1, is provided.

Figure 1B:
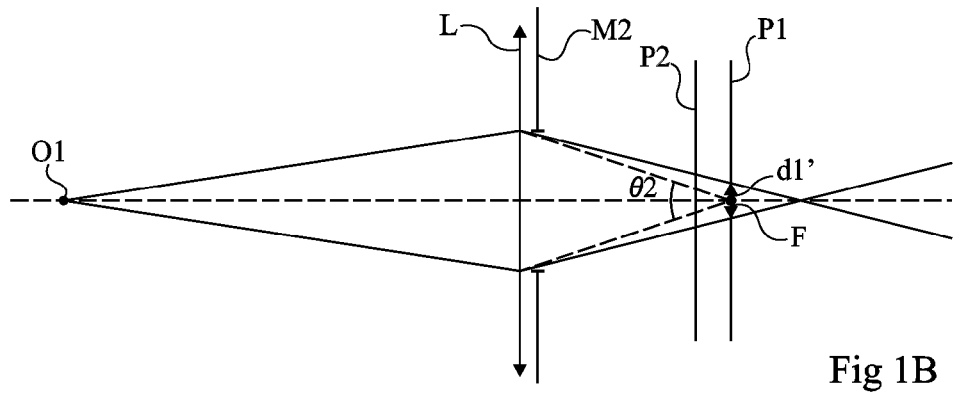
Figure 2A:
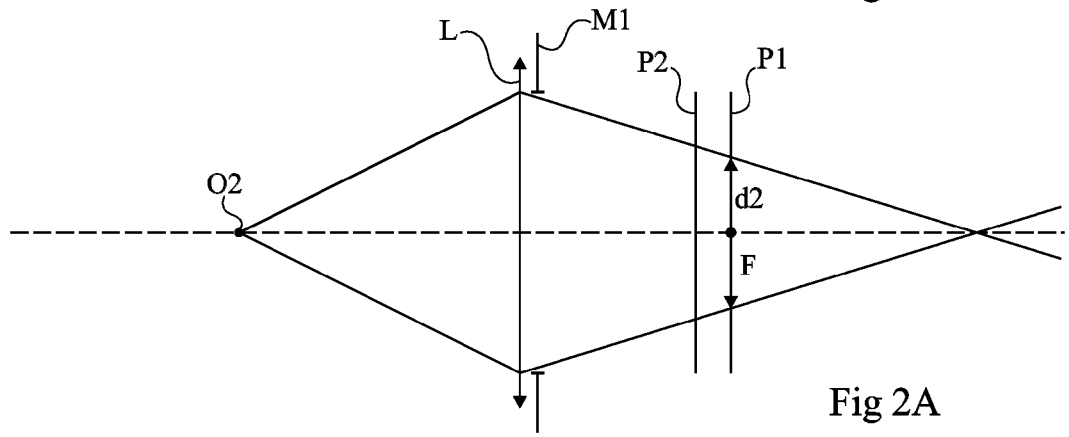

The angular aperture of lens L is defined by angle $\theta 1$ in FIG. 1A, respectively angle $\theta 2$ in FIG. 1B, formed between two beams arriving onto the shutter contour from an infinite distance, at the level of focal point F.

In FIGS. 1A and 1B, an object O1 is placed on the optical axis of the lens at a first distance from it. In focal plane P1 of the lens, object O1 forms a blurred image having a diameter which varies according to the angular aperture of the lens.

Since angular aperture $\theta 1$ of the device of FIG. 1A is larger than angular aperture $\theta 2$ of the device of FIG. 1B (shutter M1 having a greater opening than shutter M2), the image of object O1 in the focal plane of lens L in the case of FIG. 1A has a diameter d1 greater than diameter d1' of the image of object O2 in the focal plane of the lens in the case of FIG. 1B (the images have a variable sharpness).

Figure 2B:
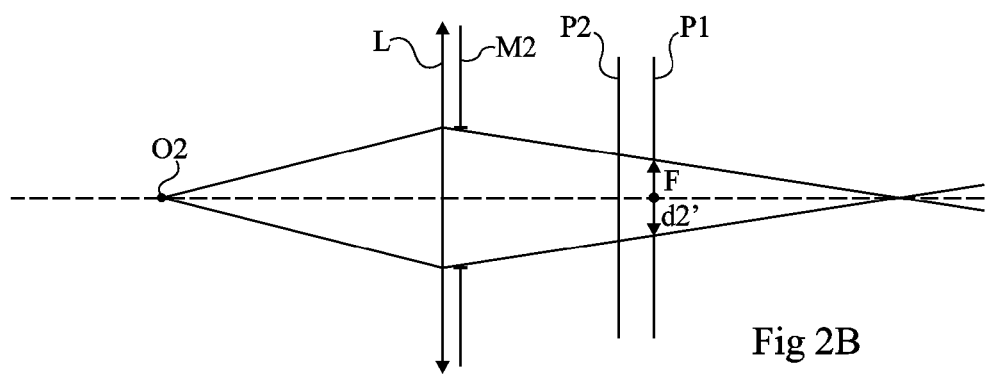

In FIGS. 2A and 2B, an object O2 is placed on the optical axis of lens L at a second distance from it, shorter than the first distance separating the lens from object O1. The image formed by object O2 in the focal plane of the lens has a diameter d2 in FIG. 2A, greater than diameter d1 of the image of object O1 of FIG. 1A. In FIG. 2B, the image defined by object O2 associated with shutter M2 has a diameter d2' smaller than diameter d2 but greater than diameter d1'.

Thus, according to the distance between an object and the lens, and according to the angular aperture thereof, images of different sizes are obtained in the focal plane of the lens. It is thus possible to associate the size of the image of an object, seen in a predefined reading plane, with a distance of the object with respect to the lens. The two images of the same object obtained using lenses with different angular apertures may also be associated with the distance from the object to the lens. The image sensor provided herein is based on this last principle.

It should be noted that the observations on the diameters of the images obtained in the focal plane of lens L in the different cases of FIGS. 1A, 1B, 2A, and 2B may also be made if the reading plane is a plane P2 different from focal plane P1. It is, however, necessary to adapt the reading plane positioning according to the distances of objects which are desired to be detected, so that an association of two images of an object obtained with optical devices of different angular apertures in two planes can only be associated with a single distance of the detected object. For example, the sensor provided herein may have a different structure according to whether the objects to be detected are at a distance shorter than a few meters (for example in the case of video games where a person's motion should be detected) or at a distance capable of varying all the way to infinity.

It is provided to take advantage of these properties to form an integrated image sensor providing information as to the distance to objects contained in a scene in integrated fashion. To achieve this, it is provided to simultaneously perform two acquisitions of a same scene using at least two sets of pixels formed on a pixel array. The pixels of the first set of pixels and the pixels of the second set have different angular apertures and are alternately formed at the surface of the pixel array. "Angular aperture" of a pixel will here designate the maximum angle between two beams of non-zero incidence passing through the optical axis of a microlens associated with the pixel, which reach the photosensitive area of the pixel (which are effectively detected).

The forming of pixels of different angular apertures enables to detect distances to objects according to the principle discussed hereabove in relation with FIGS. 1A, 1B, 2A, and 2B. In the provided sensor, the angular aperture of the pixels is modified by their very structure.

The images detected by each of the two sets of pixels, called sub-images hereafter, and the size of the objects of the scene observed on these sub-images are then compared, to thus deduce the remoteness of the objects.

It should be noted that it may also be provided to form more than two alternated types of pixels having different angular apertures if a finer detection is desired.

Figure 3A:
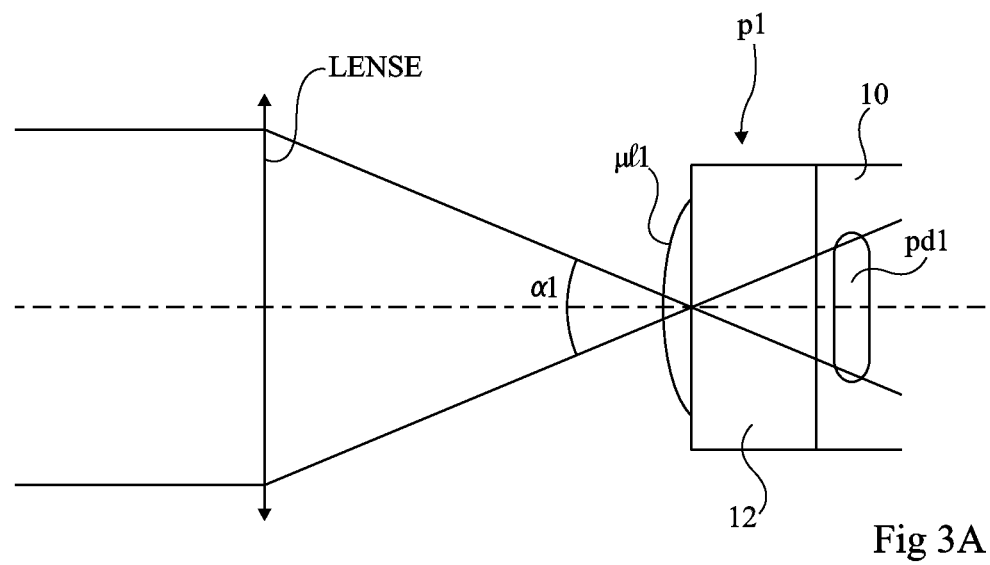
FIGS. 3A and 3B illustrate the operation of an image sensor according to an embodiment.
Figure 3B:
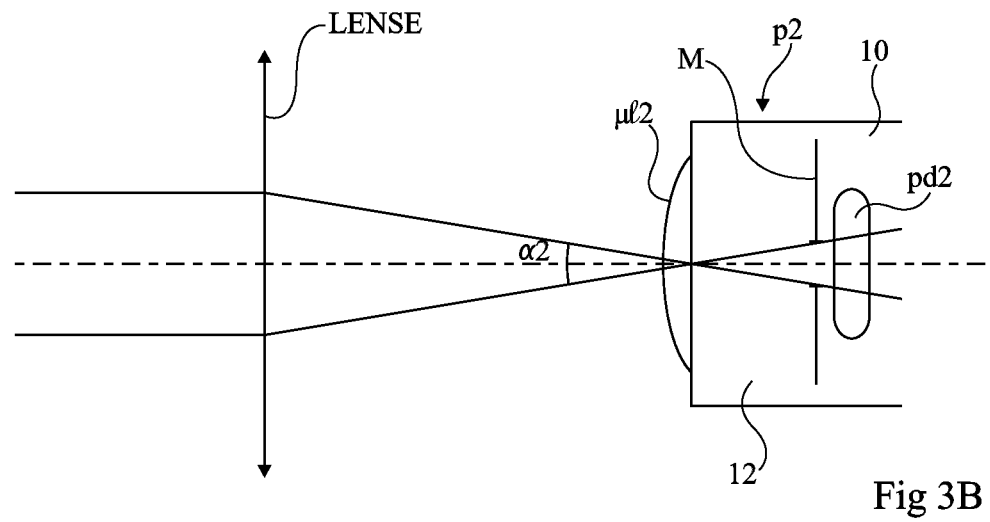

This principle is illustrated in FIGS. 3A and 3B, which show a pixel p1 of a first set of pixels and a pixel p2 of a second set of pixels. Pixels p1 and p2 are provided to be formed next to each other in the pixel array, and detect, in the example of FIGS. 3A and 3B, objects located at an infinite distance.

Pixel p1, respectively p2, illustrated in FIG. 3A, respectively 3B, comprises a photodetection area pd1, respectively pd2, formed in a semiconductor substrate 10. Substrate 10 is topped with insulating material 12, for example, the insulating material of an interconnection stack. A color filter, not shown, may be provided at the surface of insulating material 12 if the image sensor is a color sensor.

A microlens μ11, respectively μ12, is formed on insulating material 12 in front of photodetection area pd1, respectively pd2. A main lens, LENSE, schematically shown in FIGS. 3A and 3B, is formed above the set of pixels forming the image sensor. In the shown example, microlenses μ11 and μ12 are placed at the focal point of main lens LENSE. It should be noted that these lenses may also be placed at a variable distance from main lens LENSE, according to the distance to objects which are desired to be detected.

Pixel p2 of FIG. 3B differs from pixel p1 of FIG. 3A in that angular aperture a2 of this pixel is decreased, by being limited by a shutter M directly provided in pixel p2.

When pixels p1 and p2 are placed next to each other, these pixels receive data from a same portion of the scene to be acquired. However, due to the modification of the angular aperture of these pixels, the sub-image detected by photodetection areas pd1 and pd2, or by a set of alternated pixels such as pixels pd1 and pd2, does not have the same size, its size varying according to the remoteness of the detected object.

Thus, by comparing the sub-image acquired by the set of first pixels having a first angular aperture $\alpha 1$ (pixels p1) and the sub-image acquired by second pixels having a second angular aperture $\alpha 2$ (pixels p2), the remoteness of the objects which are detected can be determined. To achieve this, the size differences of the sub-images obtained on the sets of first and second pixels (the ratio between these sizes, for example) may be compared by means of adapted comparison means and these size differences may be compared, by means of analysis means, with size differences of reference images, for example, stored in an external memory.

The size differences of reference images, associated with distances to objects, depend on the image sensor structure, on the distance separating the main lens and the microlenses, on the distance separating the microlenses from the photodetection areas, as well as on the distance range of the objects which are desired to be detected. It will be within the abilities of to those skilled in the art, knowing the distance range of objects to be detected, to readily adapt the devices provided herein to obtain a set of reference measurements.

Advantageously, a comparison of the two sub-images obtained by the two sets of pixels with a set of data stored in a database consumes little time. Thus, the method provided herein is compatible with the real-time 3D acquisition of a moving scene.

To form pixels p1 and p2 of different angular apertures $\alpha 1$ and $\alpha 2$, different pixel structures are provided.

Figure 4:
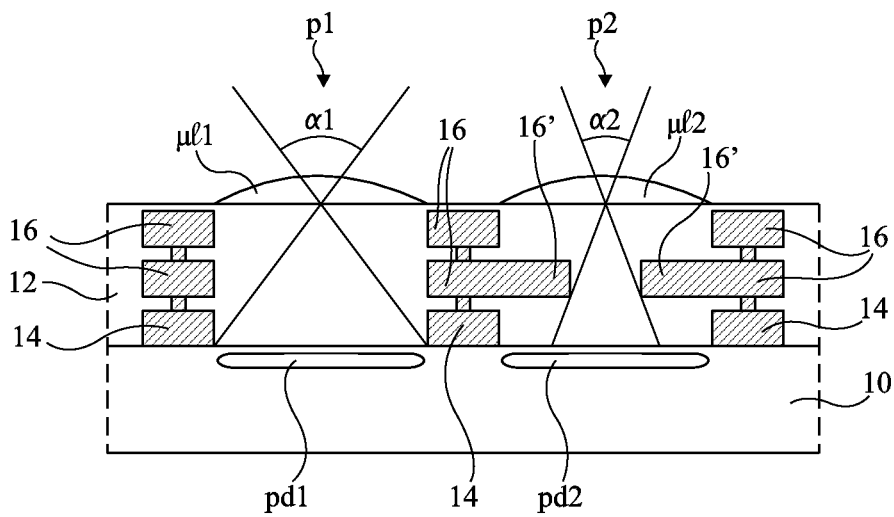

FIGS. 4, 5, and 6 illustrate different associations of first and second pixels, p1 and p2, having different angular apertures. In the different drawings, angular aperture $\alpha 1$ of pixel p1 located to the left is maximum, that is, the pixel is not modified with respect to conventional pixel structures, while angular aperture $\alpha 2$ of pixel p2 is decreased.

In each of these drawings, pixels p1 and p2 comprises photodetection areas pd1 and pd2 formed at the surface of a semiconductor substrate 10. On substrate 10, elements for transferring the photogenerated charges 14 and a stack of interconnection levels comprising metal tracks and vias 16 surrounded with an insulating material 12 are provided.

In the example of FIG. 4, to modify angular aperture $\alpha 2$ of pixel p2, it is provided to modify an interconnection level 16 formed above photodetection area pd2 of pixel p2 so that metal tracks 16 of this level have extensions 16' which limit the angular aperture of the pixel: extensions 16' (or isolated metal tracks) are formed above the periphery of photodetection area pd2. Preferably, metal extensions 16' are formed as close as possible to photodetection area pd2 to have a well-defined angular aperture of pixel p2.

In the example of FIG. 5, pixel p2 has an angular aperture $\alpha 2$ decreased due to the modification of photogenerated charge transfer elements 14 formed at the surface of substrate 10. The charge transfer elements generally are MOS transistors comprising polysilicon and silicide gates. The silicide layer is an opaque layer. Thus, decreased angular aperture $\alpha 2$ of pixel p2 is obtained by forming extensions 14' of charge transfer elements 14 at the surface of substrate 10, in front of the periphery of photodetection area pd2. It may also be provided to form isolated opaque silicide areas on the periphery of the photodetection area, for example, directly on substrate 10.

More generally, the decreased angular aperture of pixel p2 may be obtained by forming, in front of the pixel periphery and between the scene to be detected and the photodetection area, an opaque mask. The mask will preferably be formed as close as possible to the photodetection areas to perform an efficient masking. For example, in the case of a to back-side illuminated image sensor, a local metal layer, or a black resin, may be formed on the back side of the semiconductor substrate in front of the periphery of the photodetection area.

In the example of FIG. 6, angular aperture $\alpha 2$ of pixel p2 is decreased by the forming of a photodetection area pd2' having a surface area smaller than the surface area of photodetection area pd1. To optimize the operation of the device of FIG. 6, it may be provided to form insulating regions on either side of photodetection area pd2'. Advantageously, the modification of the size of photodetection areas pd2' to modify the angular aperture of the corresponding pixel may be provided on any type of image sensor, and is especially adapted to the forming of pixels of a back-side illuminated image sensor.

In the case where a three-dimensional image sensor enabling to both obtain an indication of the distance to detected objects and information relative to the very image, the image of the scene may be obtained by only using the information detected by the image sensor pixels of maximum angular aperture (by the set of first pixels).

It may also be provided to form a three-dimensional color image based on the information relative to the distance to objects and on the detected image. In this case, at least one pixel having a maximum angular aperture and at least one pixel having a decreased angular aperture may be provided to be formed in a conventional color filter pattern used to detect a color image, or first elementary patterns of the color image sensor (for example, an elementary Bayer pattern) comprising pixels of maximum angular aperture, next to second elementary patterns of the color image sensor comprising pixels of decreased angular aperture may be provided.

FIG. 7 illustrates an example of a configuration such as hereabove in the case where the color image sensor comprises color filters arranged above the pixel array according to a Bayer pattern (that is, comprising, for each association of twice two pixels, two diagonally-arranged green pixels G, a blue pixel B, and a red pixel R).

To obtain the information relative to the distance to objects of a scene, it is provided to form a structure of color filters distributed according to a Bayer pattern, one of the pixels associated with a green color filter being modified to have a decreased angular aperture with respect to the adjacent pixels. Thus, each elementary Bayer pattern (in FIG. 7, the pixels of a same elementary Bayer pattern bear the same reference index) comprises three conventional pixels (of maximum angular aperture) topped with red, blue, and green color filters $R_1$, $B_1$, and $G_1$, and a pixel modified to have a smaller angular aperture, associated with a green color filter $G_1'$.

Thus, each association of four pixels of a Bayer pattern enables to obtain information relative to both the color of the objects in the scene and to the distance to these objects. Other pixel configurations may be formed as long as an association of at least two sets of pixels having different angular apertures is provided.

Specific embodiments of the invention have been described. Various alterations and modifications will occur to those skilled in the art. In particular, the distance between the main lens of the image sensor and the microlenses associated with the different pixels, as well as the distances between microlenses and pixel photodetection areas will be adjusted according to the distance to objects which are desired to be detected. For example, if a three-dimensional sensor detecting distances reaching infinity is desired to be formed, the microlenses may be formed in the focal plane of the main lens. Conversely, if shorter distances are desired to be detected, especially to detect a person's motions in the case of video games, these distances may be adjusted differently.

Such alterations, modifications, and improvements are intended to be part of this disclosure, and are intended to be within the spirit and the scope of the invention. Accordingly, the foregoing description is by way of example only and is not intended to be limiting. The present invention is limited only as defined in the following claims and the equivalents thereto.

What is claimed is:

1. An integrated image sensor capable of determining the distance to at least one object contained in a scene, the sensor comprising
    at least a set of first pixels and a set of second pixels, the first and second pixels being alternately distributed in an array, the first pixels having a different angular aperture than the second pixels,
    the sensor being configured to compare a first sub-image obtained by the set of first pixels with a second sub-image obtained by the set of second pixels, and
    the sensor being configured to determine a size difference between at least one object of the scene contained in the first and second sub-images and to deduce therefrom the distance to the at least one object,
    wherein the angular aperture of each first pixel denotes a maximum angle between two beams of non-zero incidence passing through an optical axis of a first microlens associated with said first pixel to reach a photodetection area of said first pixel,
    wherein the angular aperture of each second pixel denotes a maximum angle between two beams of non-zero incidence passing through an optical axis of a second microlens associated with said second pixel to reach a photodetection area of said second pixel.

2. The sensor of claim 1, wherein the different angular apertures of the first and of the second pixels are obtained by forming, in the first and second pixels, photodetection areas having different surface areas.

3. The sensor of claim 1, wherein the different angular apertures of the first and of the second pixels are obtained by forming, in front of peripheries of photodetection areas formed in the first and second pixels and between the scene to be analyzed and the photodetection areas, an opaque mask.

4. The sensor of claim 1, comprising a semiconductor substrate having photodetection areas and elements for transferring photogenerated charges, a surface of the semiconductor substrate being topped with a stack of interconnection levels comprising metal tracks surrounded with an insulating material, the sensor being illuminated on this surface.

5. The sensor of claim 4, wherein the different angular apertures of the first pixels and of the second pixels are obtained by forming extensions of metal tracks in front of peripheries of the photodetection areas.

6. The sensor of claim 4, wherein the different angular apertures of the first pixels and of the second pixels are obtained by forming extensions of the elements for transferring photogenerated charges, the extensions being formed in front of peripheries of the photodetection areas.

7. The sensor of claim 4, wherein the different angular apertures of the first pixels and of the second pixels are obtained by forming isolated silicide elements in front of the peripheries of the photodetection areas.

8. The sensor of claim 1, wherein the array pixels are associated with color filters distributed in a Bayer pattern, the first pixels being associated with blue and red color filters and with first green color filters, the second pixels being associated with second green color filters of the pattern.

9. A method of determining the distance to objects contained in a scene by using the integrated image sensor of claim 1, comprising steps of:
    acquiring a scene;
    comparing a first sub-image detected by the set of first pixels with a second sub-image detected by the set of second pixels;
    determining size differences between corresponding objects contained in the first sub-image and in the second sub-image; and
    comparing the size differences of the objects with reference data to associate the size differences with distances to objects in the scene.

10. An image sensor comprising:
    a first pixel having a first angular aperture, the first pixel being configured to obtain a first image of a scene and comprising a first photodetection structure with a first surface area; and
    a second pixel having a second angular aperture, the second pixel being configured to obtain a second image of the scene and comprising a second photodetection structure having a second surface area different than the first surface area,
    wherein the image sensor is configured to use the first and second images to determine a distance between the image sensor and an object contained in the scene.

11. The image sensor of claim 10, wherein using the first and second images to determine the distance between the image sensor and the object comprises:
    determining a relationship between a first size of the object in the first image and a second size of the object in the second image; and
    using the relationship between the first size of the object in the first image and the second size of the object in the second image to determine the distance between the image sensor and the object.

12. The image sensor of claim 11, wherein determining a relationship between the first size of the object in the first image and the second size of the object in the second image comprises determining a difference between the first size of the object in the first image and the second size of the object in the second image.

13. The image sensor of claim 11, wherein determining a relationship between the first size of the object in the first image and the second size of the object in the second image comprises determining a ratio between the first size of the object in the first image and the second size of the object in the second image.

14. The image sensor of claim 11, wherein using the relationship between the first size of the object in the first image and the second size of the object in the second image to determine the distance between the image sensor and the object comprises comparing the relationship between the first size of the object in the first image and the second size of the object in the second image to reference data associated with one or more reference images.

15. The image sensor of claim 10, wherein the image sensor comprises an opaque mask, and wherein at least a portion of the opaque mask is disposed above a peripheral portion of the first photodetection structure of the first pixel and/or disposed between the peripheral portion of the photodetection structure of the first pixel and a microlens of the first pixel.

16. The image sensor of claim 15, wherein the opaque mask comprises at least a portion of an interconnection structure, at least a portion of a metallic structure, at least a portion of a charge transfer element, and/or at least a portion of a silicide layer.

17. The image sensor of claim 10, wherein the image sensor comprises an interconnection structure, and wherein at least a portion of the interconnection structure is disposed above a peripheral portion of the first photodetection structure of the first pixel and/or disposed between the peripheral portion of the first photodetection structure of the first pixel and a microlens of the first pixel.

18. The image sensor of claim 10, wherein the image sensor comprises a metallic structure, and wherein at least a portion of the metallic structure is disposed above a peripheral portion of the first photodetection structure of the first pixel and/or disposed between the peripheral portion of the first photodetection structure of the first pixel and a microlens of the first pixel.

19. The image sensor of claim 10, wherein the image sensor comprises a charge transfer element, and wherein at least a portion of the charge transfer element is disposed above a peripheral portion of the first photodetection structure of the first pixel and/or disposed between the peripheral portion of the first photodetection structure of the first pixel and a microlens of the first pixel.

20. The image sensor of claim 10, wherein the image sensor comprises a silicide layer, and wherein at least a portion of the silicide layer is disposed above a peripheral portion of the first photodetection structure of the first pixel and/or disposed between the peripheral portion of the first photodetection structure of the first pixel and a microlens of the first pixel.

21. The image sensor of claim 10, wherein the first pixel and the second pixel are arranged in a Bayer pattern.

22. The image sensor of claim 21, wherein the first pixel comprises a first green pixel of the Bayer pattern, and wherein the second pixel comprises a second green pixel of the Bayer pattern.

23. The image sensor of claim 10, wherein an angular aperture of a pixel comprises a maximum angle between two optical beams detected by a photosensitive area of a pixel, the two optical beams being of non-zero incidence passing through an optical axis of a microlens associated with the pixel.

24. The image sensor of claim 10, wherein the distance between the image sensor and the object is greater than approximately one centimeter.

25. The image sensor of claim 10, wherein:
the image sensor includes a plurality of pixels having a respective plurality of angular apertures, the plurality of pixels being configured to obtain a respective plurality of images of a scene, the plurality of pixels including the first and second pixels, the plurality of angular apertures including the first and second angular apertures, the plurality of images including the first and second images, and
the image sensor is configured to use the plurality of images to determine the distance between the image sensor and the object contained in the scene.

26. The image sensor of claim 10, wherein the first pixel is disposed adjacent to the second pixel.

27. A method comprising:
obtaining first and second images of a scene, the first and second images acquired by at least one first pixel and at least one second pixel, respectively, the at least one first pixel having an opaque mask covering a portion of at least two sides of a first photodetection area, the scene including an object;
determining a relationship between a first size of the object in the first image and a second size of the object in the second image; and
using the relationship between the first size of the object in the first image and the second size of the object in the second image to determine the distance between the image sensor and the object.

28. The method of claim 27, wherein determining a relationship between the first size of the object in the first image and the second size of the object in the second image comprises determining a difference between the first size of the object in the first image and the second size of the object in the second image.

29. The method of claim 27, wherein determining a relationship between the first size of the object in the first image and the second size of the object in the second image comprises determining a ratio between the first size of the object in the first image and the second size of the object in the second image.

30. The method of claim 27, wherein using the relationship between the first size of the object in the first image and the second size of the object in the second image to determine the distance between the image sensor and the object comprises comparing the relationship between the first size of the object in the first image and the second size of the object in the second image to reference data associated with one or more reference images.

31. An image sensor comprising:
means of obtaining first and second images of an object in a plane of the image sensor comprising:
first and second photodetection means, and
an opaque mask covering a portion of at least two sides of at least one of the first and second photodetection means;
wherein a first size of the object in the first image differs from a second size of the object in the second image, and wherein the image sensor is configured to use the first and second images to determine a distance between the image sensor and the object.

32. An image sensor comprising:
a first pixel having a first angular aperture defined by a first surface area of a first photodetection region, the first pixel being configured to obtain a first image of a scene; and
a second pixel having a second angular aperture defined by a second surface area of a second photodetection region, the second pixel being configured to obtain a second image of the scene,
wherein a difference between the first and second angular apertures is determined, at least in part, by at least one structural property selected from a group consisting of (1) a difference between the first and second surface areas, (2) a portion of an opaque mask, interconnection structure, metallic structure, charge transfer element, and/or silicide layer disposed above at least two sides of a peripheral portion of at least one of the first and second photodetection regions, and (3) a portion of an opaque mask, interconnection structure, metallic structure, charge transfer element, and/or silicide layer disposed between a peripheral portion of the photodetection structure and a microlens of the first pixel.

33. The image sensor of claim 32, wherein the image sensor comprises a first plurality of pixels having the first angular aperture and a second plurality of pixels having the second angular aperture, the first plurality of pixels including the first pixel, the second plurality of pixels including the second pixel, the first and second pluralities of pixels being alternately distributed in an array.

34. An integrated image sensor capable of determining the distance to at least one object contained in a scene, the sensor comprising:
- at least a set of first pixels and a set of second pixels, the first and second pixels being alternately distributed in an array, the first pixels having a different angular aperture than the second pixels,
- the sensor being configured to compare a first sub-image obtained by the set of first pixels with a second sub-image obtained by the set of second pixels, and
- the sensor being configured to determine a size difference between at least one object of the scene contained in the first and second sub-images and to deduce therefrom the distance to the at least one object,
- wherein the different angular apertures of the first and of the second pixels result from opaque masks formed on at least two sides of front peripheries of photodetection areas formed in the first and second pixels.

* * * * *